United States Patent
Takahashi

(10) Patent No.: US 8,130,892 B2
(45) Date of Patent: Mar. 6, 2012

(54) ADPLL FREQUENCY SYNTHESIZER

(75) Inventor: Kenji Takahashi, Miyagi (JP)

(73) Assignee: Panasonic Corporation, Osaka (JP)

( * ) Notice: Subject to any disclaimer, the term of this patent is extended or adjusted under 35 U.S.C. 154(b) by 905 days.

(21) Appl. No.: 12/171,800

(22) Filed: Jul. 11, 2008

(65) Prior Publication Data

US 2009/0052508 A1 Feb. 26, 2009

(30) Foreign Application Priority Data

Jul. 13, 2007 (JP) ................................ 2007-184865

(51) Int. Cl.
*H03D 3/24* (2006.01)
*H03L 7/00* (2006.01)
(52) U.S. Cl. .............................. 375/376; 331/18; 331/25
(58) Field of Classification Search .................. 375/376; 327/156, 159; 331/1 R, 1 A, 18, 23, 25
See application file for complete search history.

(56) References Cited

U.S. PATENT DOCUMENTS

| | | | |
|---|---|---|---|
| 7,292,618 B2 * | 11/2007 | Tal et al. | 375/376 |
| 7,777,576 B2 * | 8/2010 | Waheed et al. | 331/25 |
| 2003/0133522 A1 * | 7/2003 | Staszewski et al. | 375/376 |
| 2007/0085579 A1 * | 4/2007 | Wallberg et al. | 327/156 |
| 2007/0085622 A1 * | 4/2007 | Wallberg et al. | 331/179 |

* cited by examiner

*Primary Examiner* — Betsy Deppe
(74) *Attorney, Agent, or Firm* — Wenderoth, Lind & Ponack, L.L.P.

(57) ABSTRACT

In an ADPLL frequency synthesizer where a frequency control word is changed from FCW0 to FCW2, a control sensitivity estimation section firstly measures oscillatory frequencies $f1_L$ and $f1_H$ obtained, respectively, when frequency control words $FCW1_L$ and $FCW1_H$ being used as dummies are set, and then measures an oscillatory frequency f2 obtained when a frequency control word FCW2 is set. Thereafter, based on values of the oscillatory frequencies $f1_L$, $f1_H$ and f2, the control sensitivity estimation section calculates a control sensitivity $K_{DCO}2$ obtained when the frequency control word FCW2 is set. Based on a value of the control sensitivity $K_{DCO}2$, the loop filter determines values of filter coefficients $\alpha 2$ and $\rho 2$ so as to be equal to a natural frequency $\omega_n$ and a damping factor $\zeta$, respectively, both of which have been previously designed.

3 Claims, 6 Drawing Sheets

ADPLL FREQUENCY SYNTHESIZER

BACKGROUND OF THE INVENTION

1. Field of the Invention

The present invention relates to an ADPLL frequency synthesizer included in a radio communication device, a radio measurement device or the like.

2. Description of the Background Art

In an ADPLL (All Digital Phase-Locked Loop) frequency synthesizer covering a wide band, when an oscillatory frequency of a digital controlled oscillator (DCO) changes, a control sensitivity $K_{DCO}$ of the digital controlled oscillator is changed accordingly. Thus, a phase noise characteristic with respect to the oscillatory frequency of the digital controlled oscillator is also changed.

Conventionally, the ADPLL frequency synthesizer included in a radio communication device is disclosed in FIG. 31 of the specification (patent document 1) of US Patent Application Publication No. 2003/0133522, for example. FIG. 6 is a block diagram illustrating a structure of a conventional ADPLL frequency synthesizer 100 disclosed in patent document 1.

In a digital controlled oscillator (DCO) 101 shown in FIG. 6, when an oscillatory frequency thereof changes, a control sensitivity $K_{DCO}$ of the digital controlled oscillator accordingly changes. Therefore, a control sensitivity estimation section 102 for estimating the control sensitivity $K_{DCO}$ of the digital controlled oscillator 101 operates at all times. Furthermore, in the conventional ADPLL frequency synthesizer 100, a DCO Gain normalization circuit 111 for correcting the control sensitivity $K_{DCO}$ of the digital controlled oscillator 101 is provided prior to the digital controlled oscillator 101, thereby preventing a phase noise characteristic from being changed even if the control sensitivity $K_{DCO}$ changes.

The above-described state is represented by a formula. A phase domain transfer function $H_{cl}$ of the conventional ADPLL frequency synthesizer 100 is represented by the following formula [1]. Note that $\alpha$ and $\rho$ each represents a filter coefficient of a loop filter 103, and $f_R$ represents a frequency of a reference signal FREF.

$$H_{cl}(s) = N \frac{\alpha f_R \cdot s + \rho f_R^2}{s^2 + \alpha f_R \cdot s + \rho f_R^2} \quad [1]$$

From the formula [1], a natural frequency $\omega_n$ and a damping factor $\zeta$ of the conventional ADPLL frequency synthesizer 100 are represented by the following formulas [2] and [3], respectively.

$$\omega_n = \sqrt{\rho} f_R \quad [2]$$

$$\zeta = \frac{1}{2} \frac{\alpha}{\sqrt{\rho}} \quad [3]$$

As is clear from these formulas, the phase domain transfer function $H_{cl}$ of the conventional ADPLL frequency synthesizer 100 has no term including the control sensitivity $K_{DCO}$ of the digital controlled oscillator 101 due to an effect produced by the DCO Gain normalization circuit 111. Therefore, even if the oscillatory frequency of the digital controlled oscillator 101 changes, the phase noise characteristic would not be changed accordingly if the control sensitivity estimation section 102 properly estimates a value of the control sensitivity $K_{DCO}$ at all times so as to cancel out a change amount of an undesired control sensitivity which has been changed in accordance with the changed oscillatory frequency.

However, in the conventional ADPLL frequency synthesizer 100 disclosed in patent document 1 mentioned above, the DCO Gain normalization circuit 111 for correcting the control sensitivity $K_{DCO}$ of the digital controlled oscillator 101 is provided in a loop path. Thus, a delay caused by the DCO Gain normalization circuit 111 is generated and therefore there is a problem that a PLL operation will become easily unstable. Furthermore, there is also a problem that an electric power consumption increases since the control sensitivity estimation section 102 operates at all times.

SUMMARY OF THE INVENTION

Therefore, an object of the present invention is to provide an ADPLL frequency synthesizer in which a phase noise characteristic of a digital controlled oscillator does not change even if an oscillatory frequency of the digital controlled oscillator changes, by properly estimating a control sensitivity without using a DCO Gain normalization circuit.

An aspect of the present invention is directed to an ADPLL frequency synthesizer. In order to attain the object mentioned above, the ADPLL frequency synthesizer according to the embodiment of the present invention comprises: a digital controlled oscillator operable to output a signal having a predetermined oscillatory frequency; a digital phase comparator operable to compare a phase of the oscillatory frequency of the digital controlled oscillator with a reference phase and operable to generate a phase error signal representing a difference between the phase of the oscillatory frequency of the digital controlled oscillator and the reference phase; a loop filter operable to control the oscillatory frequency of the digital controlled oscillator based on the phase error signal generated by the digital phase comparator; and a control sensitivity estimation section operable to estimate a control sensitivity of the digital controlled oscillator. Furthermore, the control sensitivity estimation section calculates two control sensitivities at dummy frequencies which are respectively lower and higher than an oscillatory frequency to be set, so as to estimate a mean value of the calculated two control sensitivities as a first control sensitivity, and to estimate a second control sensitivity at the oscillatory frequency to be set, and the loop filter updates a filter coefficient based on the first and second control sensitivities.

Furthermore, the control sensitivity estimation section may estimate the first and second control sensitivities only once each time the oscillatory frequency of the digital controlled oscillator is changed. Furthermore, the control sensitivity estimation section may estimate a plurality of control sensitivities by using a plurality of different dummy frequencies so as to determine a mean value of the plurality of control sensitivities as the first control sensitivity. In this case, it is more preferable that the plurality of different dummy frequencies include frequencies which are both lower and higher than the oscillatory frequency to be set.

Furthermore, the aforementioned ADPLL frequency synthesizer is combined with an antenna, a transmitting device operable to transmit a radio signal via the antenna, and a receiving device operable to receive a radio signal via the antenna, and provides a signal to each of the transmitting device and the receiving device, thereby realizing a radio communication device.

According to the aspect of the present invention mentioned above, it becomes possible to realize an ADPLL frequency synthesizer in which a phase noise characteristic of a digital controlled oscillator does not change even if an oscillatory frequency of the digital controlled oscillator changes, by properly estimating a control sensitivity without using a DCO Gain normalization circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, an embodiment of the present invention will be described with reference to the drawings.

Figure 1:
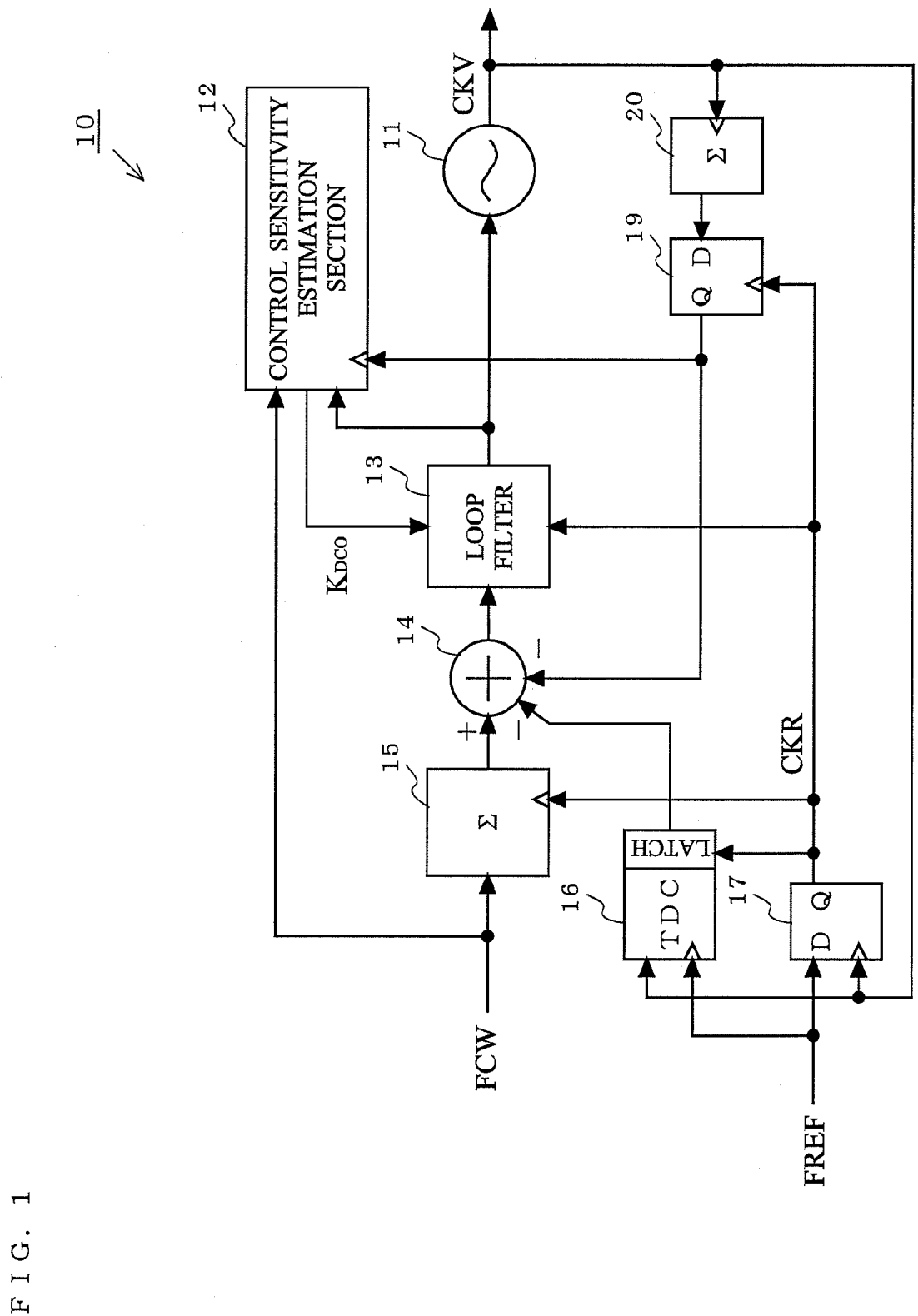
FIG. 1 is a block diagram illustrating a schematic structure of an ADPLL frequency synthesizer 10 according to an embodiment of the present invention.

FIG. 1 is a block diagram illustrating a schematic structure of an ADPLL frequency synthesizer 10 according to the embodiment of the present invention. In FIG. 1, the ADPLL frequency synthesizer 10 of the present invention comprises a digital controlled oscillator (DCO) 11, a control sensitivity estimation section 12, a loop filter 13, a digital phase comparator 14, a cumulative adder 15, a TDC (Time-to-Digital Converter) 16, a retiming circuit 17, a sampler 19, and a cumulative adder 20.

The retiming circuit 17 performs retiming on a reference signal FRFF with an output signal CKV of the digital controlled oscillator 11, thereby generating a clock CKR. The cumulative adder 20 detects a phase of the output signal CKV of the digital controlled oscillator 11. The cumulative adder 15 outputs a reference phase to which a frequency control word FCW is cumulatively added. The digital phase comparator 14 outputs, as a phase error signal, a difference between the reference phase and the phase of the digital controlled oscillator 11 to the loop filter 13. The control sensitivity estimation section 12 estimates a value of a control sensitivity $K_{DCO}$ of the digital controlled oscillator 11 by using an output signal of the loop filter 13. An output value of the loop filter 13 is inputted to a frequency control terminal of the digital controlled oscillator The ADPLL frequency synthesizer 10 of the present invention constitutes a negative feedback system as mentioned above, thereby performing a PLL (Phase Locked Loop) operation.

Figure 2:
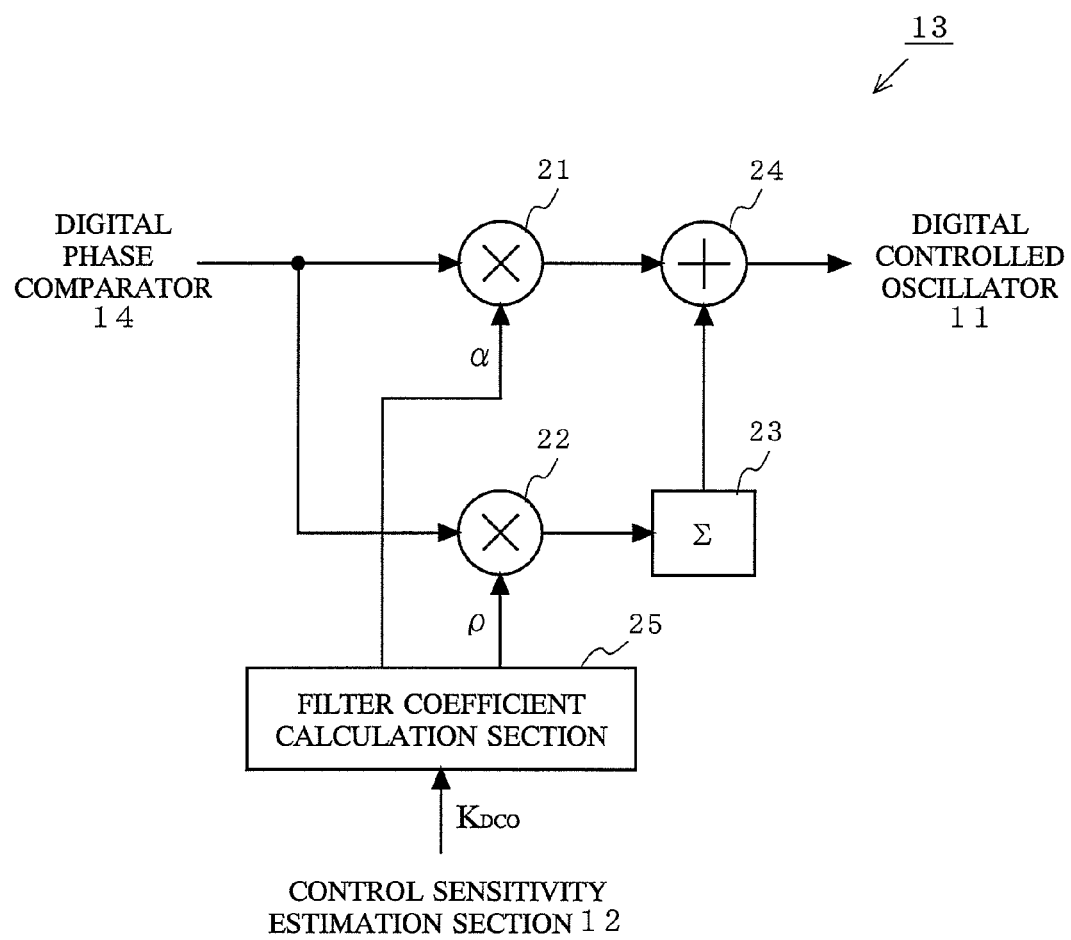
FIG. 2 is a diagram illustrating an exemplary detailed structure of a loop filter 13 shown in FIG. 1.

FIG. 2 is a diagram illustrating an exemplary detailed structure of the loop filter 13 shown in FIG. 1. In FIG. 2, the loop filter 13 includes multipliers 21 and 22, an integrator 23, an adder 24 and a filter coefficient calculation section 25.

The filter coefficient calculation section 25 calculates filter coefficients α and ρ in accordance with the value of the control sensitivity $K_{DCO}$ of the digital controlled oscillator 11 estimated by the control sensitivity estimation section 12. The multiplier 21 multiplies the phase error signal outputted from the digital phase comparator 14 by the filter coefficient α. The multiplier 22 multiplies the phase error signal outputted from the digital phase comparator 14 by the filter coefficient ρ. An output of the multiplier 22 is integrated by the integrator 23. The adder 24 adds an output of the multiplier 21 to an output of the integrator 23 so as to be outputted to the digital controlled oscillator 11.

As described above, the loop filter 13 has a linear characteristic as a signal unit.

A feature of the present invention is that the control sensitivity estimation section 12 estimates the control sensitivity $K_{DCO}$ so as to cause each of the filter coefficients α and ρ, which are to be calculated by the filter coefficient calculation section 25 based on the estimation result, to be equal to a value having a correction effect equivalent to that produced by the DCO Gain normalization circuit 111 which has been already described in the prior art. For attaining this feature, the present invention executes a process flow to be described below.

Figure 3:
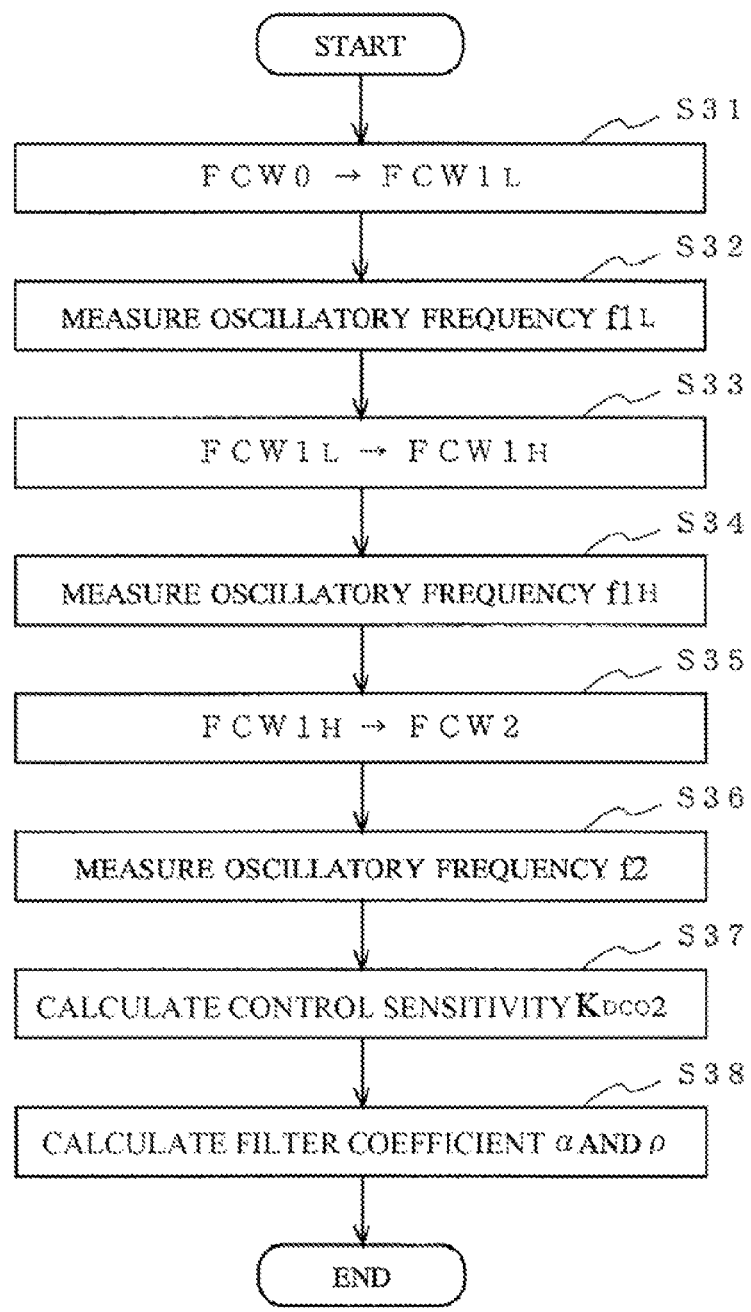
FIG. 3 is a flowchart illustrating a process flow executed by the ADPLL frequency synthesizer 10 of the present invention.
Figure 4:
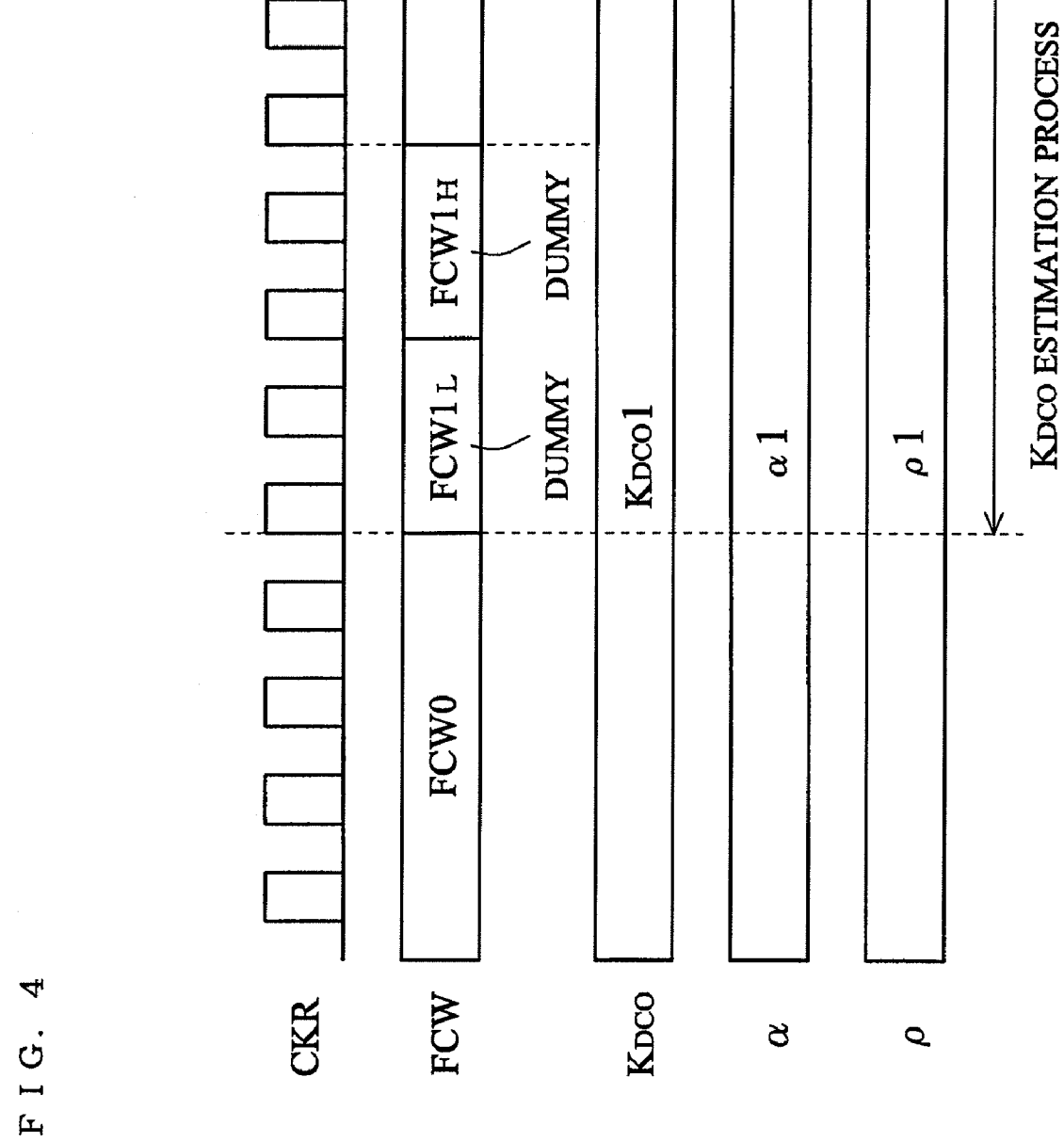
FIG. 4 is a timing chart describing an operation of the ADPLL frequency synthesizer 10 of the present invention.

FIG. 3 is a flowchart illustrating the process flow executed by the ADPLL frequency synthesizer 10 of the present invention. FIG. 4 is a timing chart describing an operation of the ADPLL frequency synthesizer 10 of the present invention.

Note that a frequency control word FCW0 is a currently set value regarding the oscillatory frequency of the digital controlled oscillator 11, while a frequency control word FCW2 is a newly set value regarding the oscillatory frequency of the digital controlled oscillator 11. Further, frequency control words $FCW1_L$ and $FCW1_H$ are values of dummy frequencies set in the vicinity of the oscillatory frequency of the frequency control word FCW2. The frequency control word $FCW1_L$ is set so as to be lower than the oscillatory frequency of the frequency control word FCW2, while the frequency control word $FCW1_H$ is set so as to be higher than the oscillatory frequency of the frequency control word FCW2.

A process shown in FIG. 3 is typically executed only once when the oscillatory frequency of the digital controlled oscillator 11 needs to be changed.

When the oscillatory frequency needs to be changed, the ADPLL frequency synthesizer 10 firstly changes the frequency control word FCW0 being currently set to the dummy frequency control word $FCW1_L$ (step S31). In accordance with this, the control sensitivity estimation section 12 calculates one-clock difference of the output value of the loop filter 13, thereby measuring an oscillatory frequency $f1_L$ of the digital controlled oscillator 11 obtained when the dummy frequency control word $FCW1_L$ is set (step S32).

Next, the ADPLL frequency synthesizer 10 changes the frequency control word $FCW1_L$ being currently set to the dummy frequency control word $FCW1_H$ (step S33). In accordance with this, the control sensitivity estimation section 12 calculates the one-clock difference of the output value of the loop filter 13, thereby measuring an oscillatory frequency $f1_H$ of the digital controlled oscillator 11 obtained when the dummy frequency control word $FCW1_H$ is set (step S34).

Then, the ADPLL frequency synthesizer 10 changes the dummy frequency control word $FCW1_H$ to the frequency control word FCW2 to be newly set (step S35). In accordance with this, the control sensitivity estimation section 12 calculates the one-clock difference of the output value of the loop filter 13, thereby measuring an oscillatory frequency f2 of the digital controlled oscillator 11 obtained when the frequency control word FCW2 is set (step S36).

Next, based on measured values of the oscillatory frequency f1$_L$, f1$_H$ and f2, the control sensitivity estimation section 12 calculates a control sensitivity K$_{DCO}$2 of the digital controlled oscillator 11 obtained when the frequency control word FCW2 is set, by using the following formulas [4a] and [4b] (step S37).

$$K_{DCO}2_L = \frac{f2-f1_L}{FCW2-FCW1_L}, K_{DCO}2_H = \frac{f2-f1_H}{FCW2-FCW1_H} \quad [4a]$$

$$K_{DCO}2 = \frac{K_{DCO}2_L + K_{DCO}2_H}{2} \quad [4b]$$

At this time, a control sensitivity K$_{DCO}$2$_L$ obtained when the dummy frequency control word FCW1$_L$ is set and a control sensitivity K$_{DCO}$2$_H$ obtained when the dummy frequency control word FCW1$_H$ is set are calculated, and a mean value of the control sensitivity K$_{DCO}$2$_L$ and the control sensitivity K$_{DCO}$2$_H$ is set as a control sensitivity K$_{DCO}$2. Thus, it becomes possible to estimate the value of the control sensitivity K$_{DCO}$ of the digital controlled oscillator 11 with a higher degree of precision.

Hereinafter, a phase noise characteristic of the ADPLL frequency synthesizer 10 of the present invention will be described. A phase domain transfer function H$_{cl}$ of the ADPLL frequency synthesizer 10 shown in FIG. 1 of the present invention is represented by the following formula [5]. Note that N represents the frequency control word, α and ρ each represents the filter coefficient of the loop filter 13, f$_R$ represents a frequency of the reference signal FREF, and K$_{DCO}$ represents the control sensitivity of the digital controlled oscillator 11.

$$H_{cl}(s) = N \frac{\alpha K_{DCO} \cdot s + \rho f_R K_{DCO}}{s^2 + \alpha K_{DCO} \cdot s + \rho f_R K_{DCO}} \quad [5]$$

From the above formula [5], a natural frequency ω$_n$ and damping factor ζ of the ADPLL frequency synthesizer 10 are represented by the following formulas [6] and [7], respectively.

$$\omega_n = \sqrt{\rho f_R K_{DCO}} \quad [6]$$

$$\zeta = \frac{\alpha}{2}\sqrt{\frac{K_{DCO}}{\rho f_R}} \quad [7]$$

As described above, the natural frequency ω$_n$ and the damping factor ζ can be designed by using the filter coefficients α and ρ, the frequency f$_R$, and the control sensitivity K$_{DCO}$.

Lastly, based on a value of the control sensitivity K$_{DCO}$2 of the digital controlled oscillator 11 estimated by the control sensitivity estimation section 12, the loop filter 13 determines, by using the following formulas [8] and [9], filter coefficients α2 and ρ2 so as to be equal, respectively, to the natural frequency ω$_n$ and the damping factor ζ, both of which have been previously designed by using the above formulas [6] and [7] (step S38).

$$\alpha 2 = \frac{2\zeta \omega_n}{K_{DCO}2} \quad [8]$$

$$\rho 2 = \frac{\omega_n^2}{f_R K_{DCO}2} \quad [9]$$

As described above, according to the ADPLL frequency synthesizer 10 of the present invention, since a control sensitivity can be estimated properly without using a DCO Gain normalization circuit, a phase noise characteristic does not change even when an oscillatory frequency of the digital controlled oscillator 11 changes. That is, a characteristic of the ADPLL frequency synthesizer 10 of the present invention can be constantly maintained equal to the natural frequency ω$_n$ and damping factor ζ, both of which have been previously designed regardless of a value of the control sensitivity K$_{DCO}$ of the digital controlled oscillator 11.

Note that in the embodiment above, the natural frequency ω$_n$ and the damping factor ζ are updated based on the value of the control sensitivity K$_{DCO}$ having been estimated. However, the values of the filter coefficients α and ρ, both of which have been previously stored in accordance with the value of the control sensitivity K$_{DCO}$, may be used. With such a structure, it is unnecessary to provide a circuit for calculating the natural frequency ω$_n$ and the damping factor ζ, thereby making it possible to simplify a circuit.

Furthermore, in the above embodiment, the phase domain transfer function of the ADPLL frequency synthesizer 10 is a secondary characteristic. However, a higher-order characteristic may be used by increasing the order of the loop filter 13. In this case, the filter coefficients α and ρ of the loop filter may be determined based on a characteristic, whose order is increased in accordance with the order of the loop filter 13, of the phase domain transfer function of the ADPLL frequency synthesizer.

(Exemplary Structure Including ADPLL Frequency Synthesizer)

Figure 5:
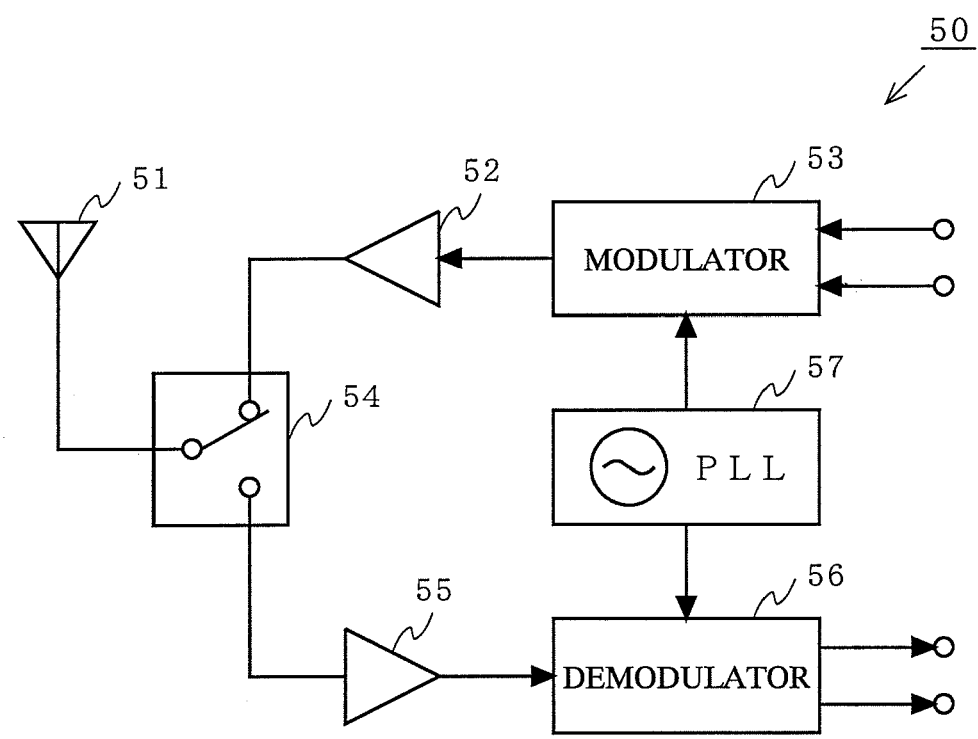
FIG. 5 is a diagram illustrating an exemplary structure of a radio communication device 50 including the ADPLL frequency synthesizer of the present invention.
Figure 6:
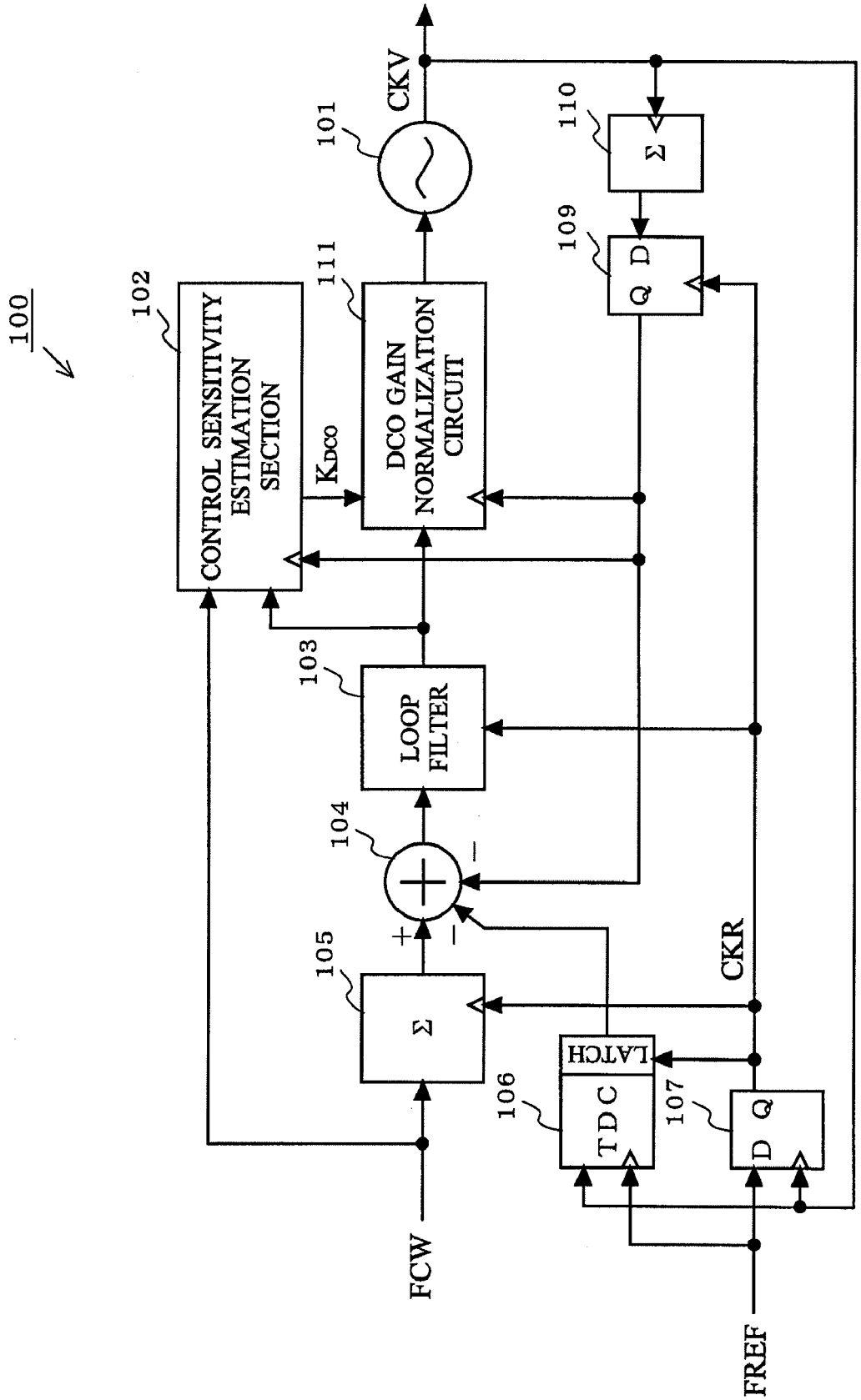
FIG. 6 is a block diagram illustrating a schematic structure of a conventional ADPLL frequency synthesizer 100.

FIG. 5 is a diagram illustrating an exemplary structure of a radio communication device 50 including the aforementioned ADPLL frequency synthesizer 10 of the present invention. In FIG. 5, the radio communication device 50 comprises an antenna 51, a power amplifier 52, a modulator 53, a switch 54, a low noise amplifier 55, a demodulator 56, and an ADPLL frequency synthesizer 57 of the present invention.

In the case where a radio signal is transmitted, the modulator 53 modulates a desired high frequency signal outputted from the ADPLL frequency synthesizer 57 with a modulated baseband signal and outputs a modulated high frequency signal. The modulated high frequency signal outputted from the modulator 53 is amplified by the power amplifier 52 so as to be radiated from the antenna 51 via the switch 54.

In the case where a radio signal is received, a modulated high frequency signal received by the antenna 51 is inputted to the low noise amplifier 55 via the switch 54 so as to be amplified, and then the amplified signal is inputted to the demodulator 56. The demodulator 56 demodulates the inputted modulated high frequency signal to a modulated baseband signal with a high frequency signal outputted from the ADPLL frequency synthesizer 57. Note that a plurality of ADPLL frequency synthesizers 57 may be used on a transmitting side and a receiving side. Furthermore, the ADPLL frequency synthesizer 57 may also act as a modulator.

While the invention has been described in detail, the foregoing description is in all aspects illustrative and not restrictive. It is understood that numerous other modifications and variations can be devised without departing from the scope of the invention.

What is claimed is:

1. An ADPLL frequency synthesizer comprising:
a digital controlled oscillator operable to output a signal having a predetermined oscillatory frequency;
a digital phase comparator operable to compare a phase of the oscillatory frequency of the digital controlled oscillator with a reference phase and operable to generate a phase error signal representing a difference between the phase of the oscillatory frequency of the digital controlled oscillator and the reference phase;
a loop filter operable to control the oscillatory frequency of the digital controlled oscillator based on the phase error signal generated by the digital phase comparator; and
a control sensitivity estimation section operable to estimate a control sensitivity of the digital controlled oscillator,
wherein the control sensitivity estimation section calculates two control sensitivities at dummy frequencies which are, respectively, lower and higher than an oscillatory frequency to be set, so as to estimate a mean value of the calculated two control sensitivities as a first control sensitivity, and to estimate a second control sensitivity at the oscillatory frequency to be set, and
wherein the loop filter updates a filter coefficient based on the first and second control sensitivities.

2. The ADPLL frequency synthesizer according to claim 1, wherein the control sensitivity estimation section estimates the first and second control sensitivities only once each time the oscillatory frequency of the digital controlled oscillator is changed.

3. A radio communication device comprising:
an antenna;
a transmitting device operable to transmit a radio signal via the antenna;
a receiving device operable to receive a radio signal via the antenna; and
an ADPLL frequency synthesizer, according to claim 1, operable to provide a signal to each of the transmitting device and the receiving device.

* * * * *